(12) United States Patent
Bernstein et al.

(10) Patent No.: US 7,865,694 B2
(45) Date of Patent: Jan. 4, 2011

(54) THREE-DIMENSIONAL NETWORKING STRUCTURE

(75) Inventors: Kerry Bernstein, Underhill, VT (US); Timothy J. Dalton, Ridgefield, CT (US); Marc R. Faucher, South Burlington, VT (US); Peter A. Sandon, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 1266 days.

(21) Appl. No.: 11/382,967

(22) Filed: May 12, 2006

(65) Prior Publication Data

US 2007/0266129 A1 Nov. 15, 2007

(51) Int. Cl.
*G06F 15/76* (2006.01)
(52) U.S. Cl. ...................................... 712/11
(58) Field of Classification Search .................. None
See application file for complete search history.

(56) References Cited

U.S. PATENT DOCUMENTS

| | | | |
|---|---|---|---|
| 5,235,672 A | 8/1993 | Carson | |
| 5,471,580 A * | 11/1995 | Fujiwara et al. | 709/249 |
| 5,834,162 A | 11/1998 | Malba | |
| 6,104,082 A * | 8/2000 | Berlin et al. | 257/665 |
| 6,269,467 B1 | 7/2001 | Chang et al. | |
| 6,441,476 B1 * | 8/2002 | Emoto | 257/686 |
| 6,622,233 B1 | 9/2003 | Gilson | |
| 6,738,891 B2 * | 5/2004 | Fujii et al. | 712/16 |
| 6,836,815 B1 * | 12/2004 | Purcell et al. | 710/317 |
| 6,901,491 B2 * | 5/2005 | Kohn et al. | 711/157 |
| 6,987,760 B2 * | 1/2006 | Calvignac et al. | 370/369 |
| 7,154,760 B2 * | 12/2006 | Konishi et al. | 361/783 |
| 7,352,067 B2 * | 4/2008 | Fukaishi et al. | 257/777 |
| 7,633,155 B2 * | 12/2009 | Sukegawa et al. | 257/723 |
| 2003/0015740 A1 | 1/2003 | Li et al. | |
| 2005/0139978 A1 | 6/2005 | Hirose | |
| 2005/0195808 A1 * | 9/2005 | Chen et al. | 370/386 |

* cited by examiner

*Primary Examiner*—Eric Coleman
(74) *Attorney, Agent, or Firm*—Cantor Colburn LLP; Michael LeStrange

(57) ABSTRACT

A multi-layer silicon stack architecture includes one or more processing layers including one or more computing elements; one or more networking layers disposed between the processing layers, the network layer includes one or more networking elements, wherein each computing element includes a plurality of network connections to adjacently disposed networking elements.

12 Claims, 8 Drawing Sheets

THREE-DIMENSIONAL NETWORKING STRUCTURE

TRADEMARKS

IBM® is a registered trademark of International Business Machines Corporation, Armonk, N.Y., U.S.A. Other names used herein may be registered trademarks, trademarks or product names of International Business Machines Corporation or other companies.

BACKGROUND

1. Technical Field

The present disclosure relates generally to electrical and electronic circuits and more specifically to a multi-layered silicon structure including multiple compute and networking elements.

2. Description of the Related Art

Currently, complex computing systems are comprised of discrete computing elements and networking elements that are interconnected by a system of cables and switches. For example, a web server farm may include several two-way servers that are interconnected with discrete cables and switches. The web server farm can be shrunk into a blade server package of two-way server blades that are plugged into a backplane that includes embedded network links and switches. Further miniaturization of such complex systems is possible but it requires the use of an expensive single piece of silicon or multi-chip packages. Recent developments in silicon structures have enabled the construction of computer structures that were formerly impractical or prohibitively expensive to build.

In addition, as a result of the design of current complex computer systems, a failure of one or more components of the complex computing systems will likely suspend the operation of the entire complex system. Therefore, what is needed is a system architecture in which the failure of one or more components in the system will not result in suspension of the operation of the system.

SUMMARY

The shortcomings of the prior art are overcome and additional advantages are provided through the use of multi-layer silicon stack architectures that implement a redundant network of redundant processors.

Exemplary embodiments include a multi-layer silicon stack architecture including: one or more processing layers including one or more computing elements; one or more networking layers disposed between the processing layers, the network layer includes one or more networking elements, wherein each computing element includes a plurality of network connections to adjacently disposed networking elements.

Exemplary embodiments also include a multi-layer silicon stack architecture including: one or more processing layers including one or more computing elements; one or more networking layers disposed between the processing layers, the network layer including one or more networking elements, wherein each computing element comprises a plurality of network connections to adjacently disposed networking elements, each computing element is connected to a plurality of networking elements, each networking element is connected to a plurality of computing elements, and the computing elements and the networking elements are connected by one or more serial or parallel connections, the computing elements include one or more heterogeneous or homogeneous processor chips, and the networking elements include a switch chip and an edge switch chip.

System and computer program products corresponding to the above-summarized methods are also described and claimed herein.

Additional features and advantages are realized through the techniques of the present invention. Other embodiments and aspects of the invention are described in detail herein and are considered a part of the claimed invention. For a better understanding of the invention with advantages and features, refer to the description and to the drawings.

TECHNICAL EFFECTS

As a result of the summarized invention, technically we have achieved a solution that provides a high-density partial mesh network with many network links between compute elements.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION

Referring now to the Figures for the purpose of illustration, it is to be understood that standard components or features that are within the purview of an artisan of ordinary skill and do not contribute to the understanding of the various exemplary embodiments are omitted from the Figures to enhance clarity.

In exemplary embodiments, a three-dimensional interconnect network structure is comprised of layers of processing or compute elements, which are layered with networking or switch elements. Each compute element can include several network connections to adjacent networking elements (e.g., networking elements disposed either above or below) forming a three-dimensional structure. In one embodiment, a compute element (e.g., a processor chip with one or more compute cores) is tied to four switch elements or chips that are disposed above the compute element. Each switch element may provide network access to up to eight other computing elements through a single hop of the network.

In other exemplary embodiments, the compute element may be tied to four other switch chips that are disposed below the compute element. Each of the switch chips provides network access to the same eight other computing elements through an independent set of network connections. Each of the switch chips may also provide network access to nine additional computing elements on another layer through a second independent set of network connections on its reverse side. Alternatively, each of the switch chips may be connected to other switch chips on another layer. Layering of compute and network layers allows for the creation of high-density partial mesh networks with many network links between compute elements, such that failure of one or more compute or network elements in the structure will merely degrade the performance of the overall structure rather than suspend operation. By varying the relative size and placement of computing elements and switch chips, other interconnect patterns are possible between computing elements and switch chips to further enhance network density and resiliency. For example, the networking or switching chips may be large relative to the processing chips and may be connected to several processing chips.

Figure 1A:
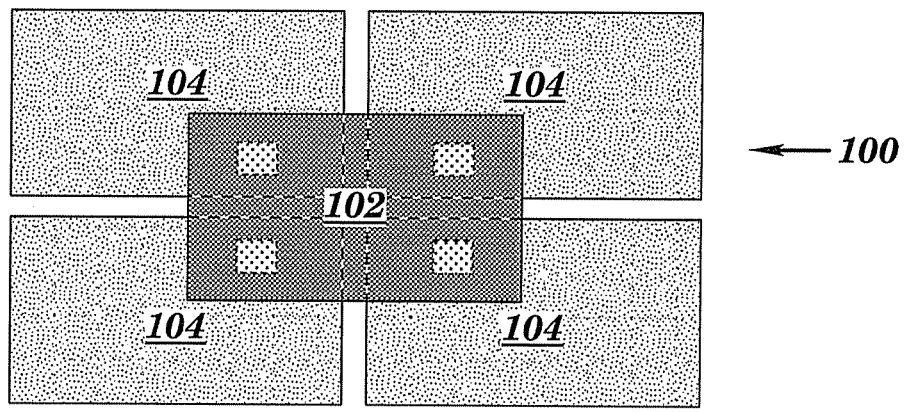
FIGS. 1a-c illustrate a three dimensional interconnect network structure in accordance with exemplary embodiments.
Figure 1B:
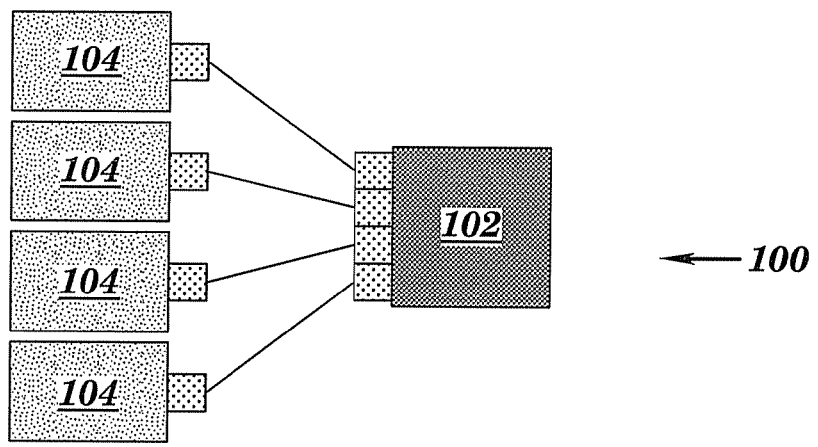
Figure 1C:

Referring now to FIG. 1a-c, a three-dimensional interconnect network structure in accordance with exemplary embodiments is illustrated generally as 100. FIG. 1a depicts a top view of the three-dimensional interconnect network structure 100, FIG. 1b depicts a network view of the three-dimensional interconnect network structure 100, and FIG. 1c depicts a side elevational view of the three-dimensional interconnect network structure 100. The three-dimensional interconnect network structure 100 includes a switch chip 102 and a plurality of processor chips 104. Each of the processor chips 104 is directly connected to the switch chip 102 with one or more redundant network connections.

Figure 2A:
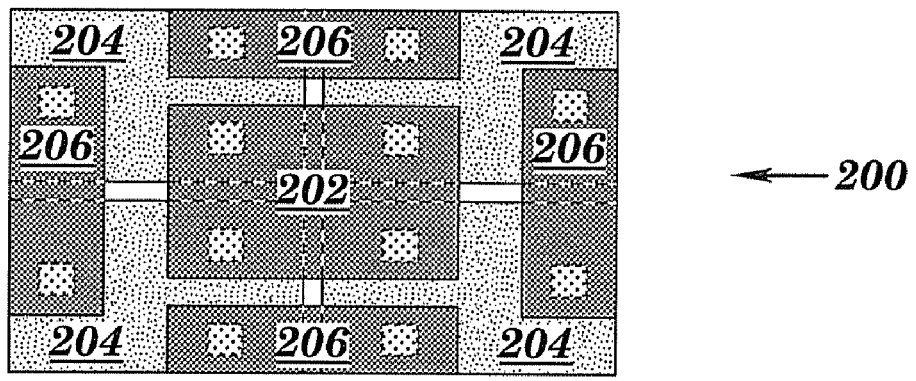
FIGS. 2a-d illustrate a three dimensional interconnect network structure with full tiling and edge switch elements in accordance with exemplary embodiments.
Figure 2B:
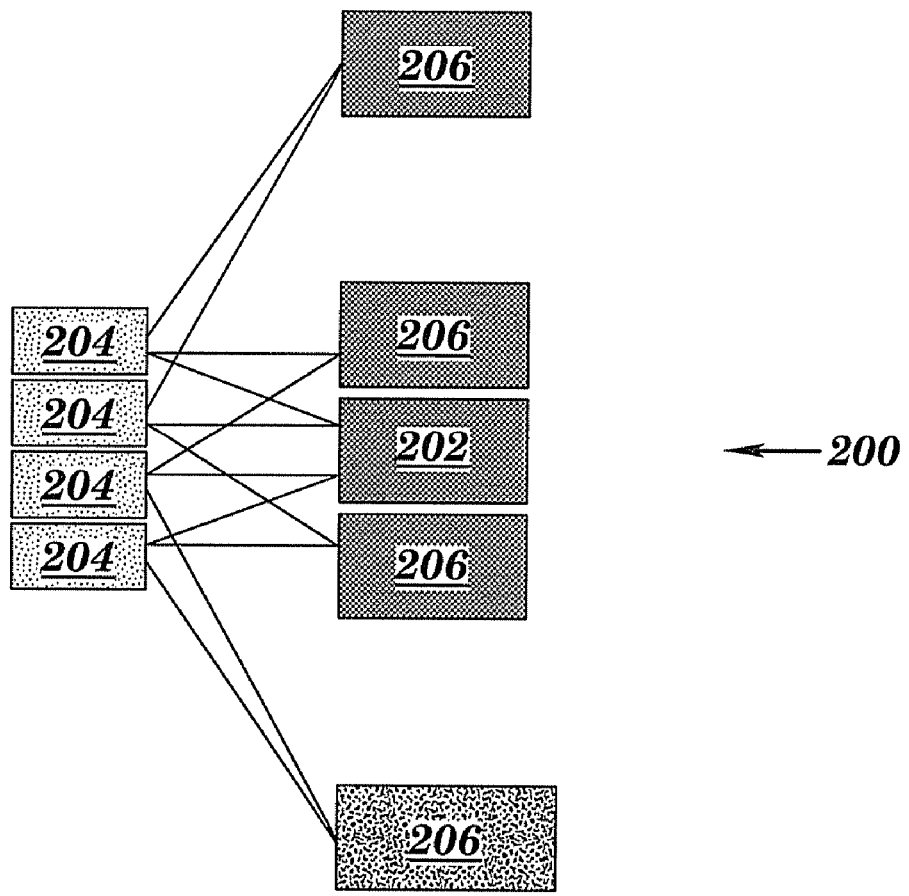
Figure 2C:
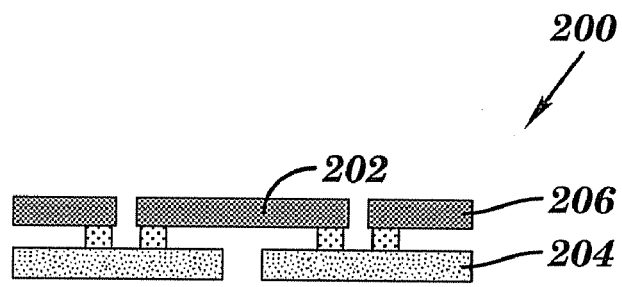
Figure 2D:
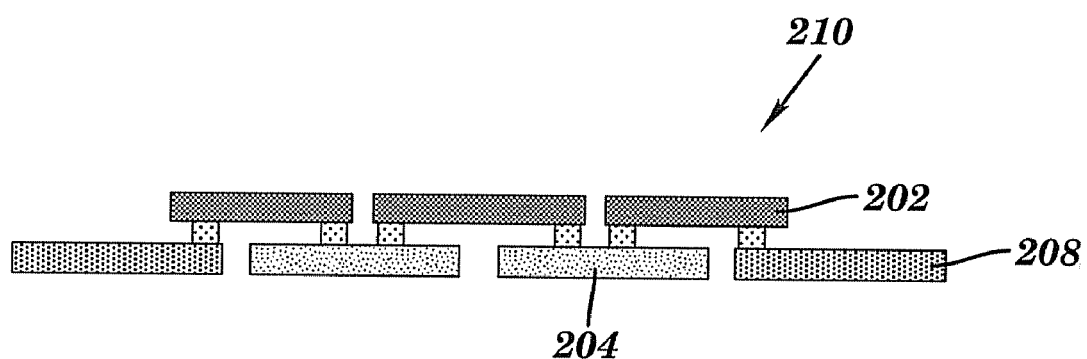

Turning now to FIG. 2a-d, a three-dimensional interconnect network structure with fall tiling and edge switch elements in accordance with exemplary embodiments is illustrated generally as 200. FIG. 2a depicts a top view of the three-dimensional interconnect network structure 200, FIG. 2b depicts a network view of the three-dimensional interconnect network structure 200, and FIG. 2c depicts a side elevational view of the three-dimensional interconnect network structure 200. The three-dimensional interconnect network structure 200 includes switch chip 202, processor chips 204, and edge switch chips 206. The edge switch chips 206 add extra connections between the processor chips 204. In one embodiment, each switch chip 202 ties four processor chips 204 together and each edge switch chip 206 ties two processor chips 204 together. The edge switch chip 206 comprises a smaller version of the switch chip 202, having less connectivity as is appropriate to the edge of the array of processors and network elements. An alternative structure 210, shown in FIG. 2d, instead uses switch chips 202 at the edge of the array to communicate outside of this assembly via links 208. These switch chips can be identical to those used in the rest of the switching network, or might be designed specifically for the purpose of electrically or optically connecting external connections to the rest of the processor network. FIG. 2d depicts a side elevational view of a three-dimensional interconnect network structure 210 in which the edge switch elements of network structure 200 connect to elements external to this assembly.

Figure 3A:
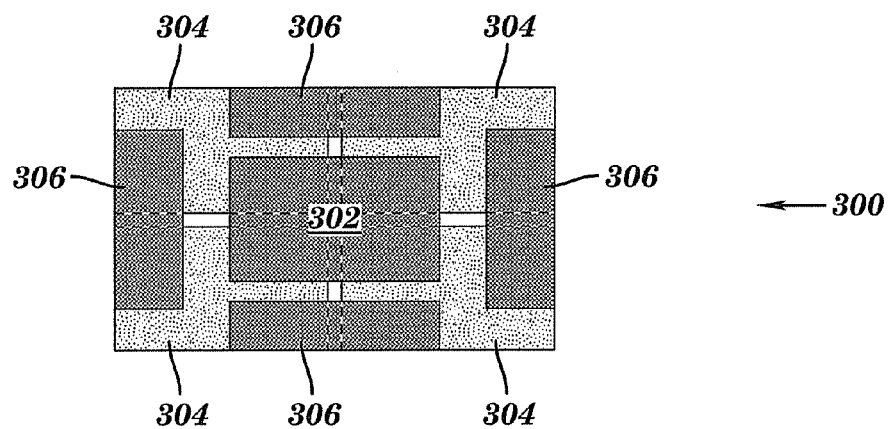
FIGS. 3a-c illustrate a three dimensional interconnect network structure with full tiling and edge network elements in accordance with exemplary embodiments.
Figure 3B:
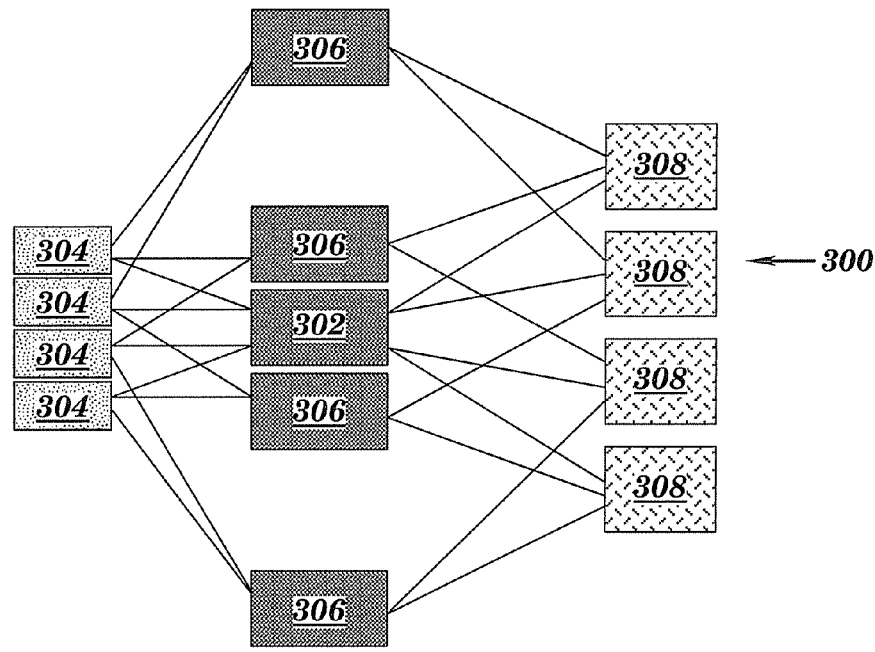
Figure 3C:
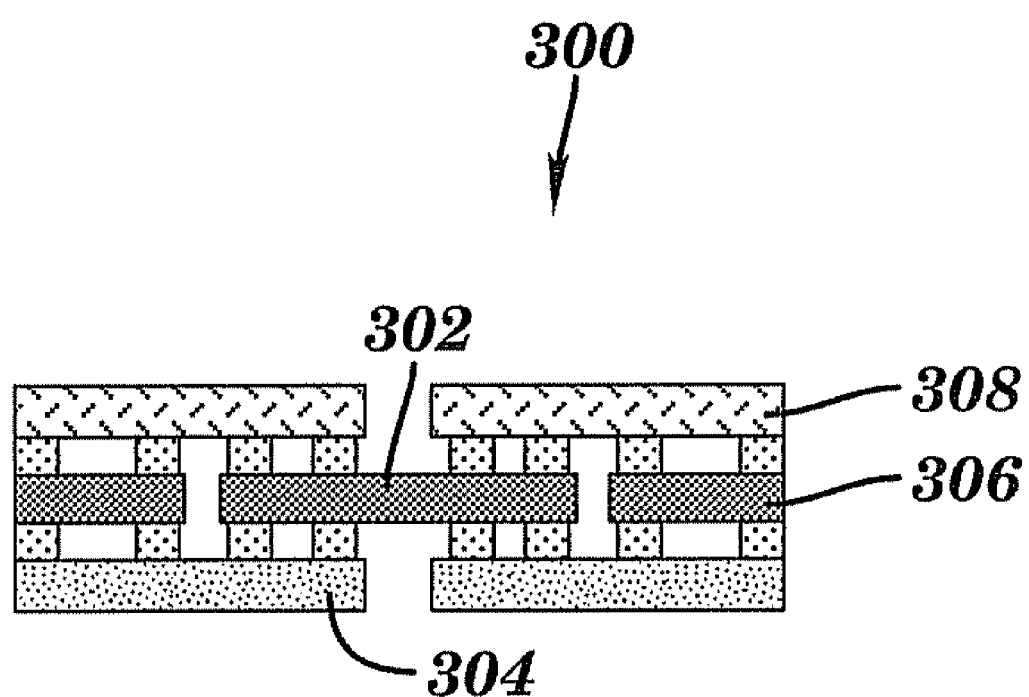

Referring now to FIG. 3a-c, a three-dimensional interconnect network structure with full tiling and edge network elements in accordance with exemplary embodiments is illustrated generally as 300. FIG. 3a depicts a top view of the three-dimensional interconnect network structure 300, FIG. 3b depicts a network view of the three-dimensional interconnect network structure 300, and FIG. 3c depicts a side elevational view of the three-dimensional interconnect network structure 300. The three-dimensional interconnect network structure 300 includes switch chip 302, processor chips 304, edge switch chips 306, and an additional layer of switch chips 308. The edge switch chips 306 add extra connections between the processor chips 304. Each switch chip on the third layer 308 includes one switch chip 302 connection and two switch chip 306 connections. Each switch chip 302 ties four processor chips 304 together. Each edge switch chip 306 ties two processor chips 304 together. The three-dimensional interconnect network structure 300 can tolerate any one network element failing.

Figure 4A:
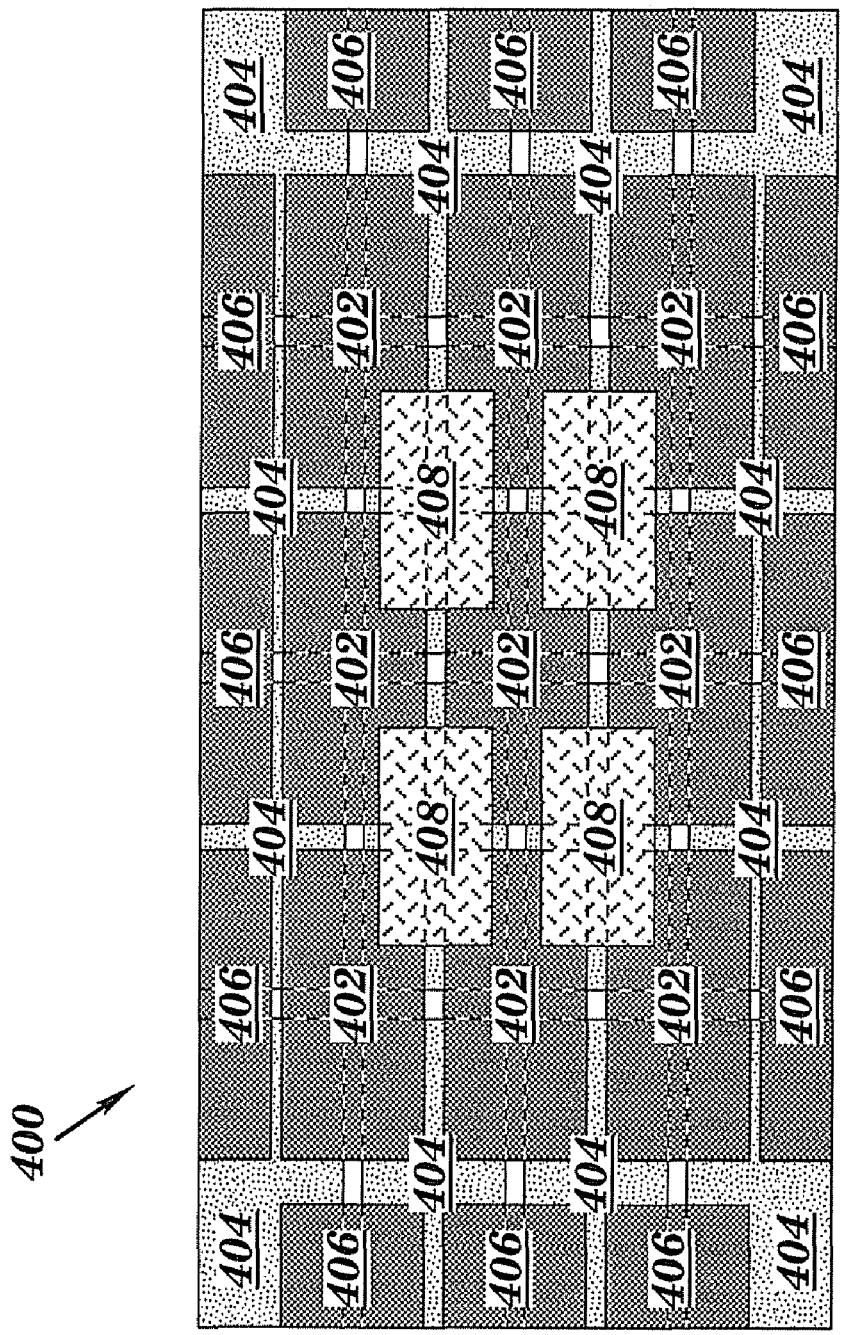
FIGS. 4a-c illustrate another three-dimensional interconnect network structure with full tiling and edge network elements in accordance with exemplary embodiments.
Figure 4B:
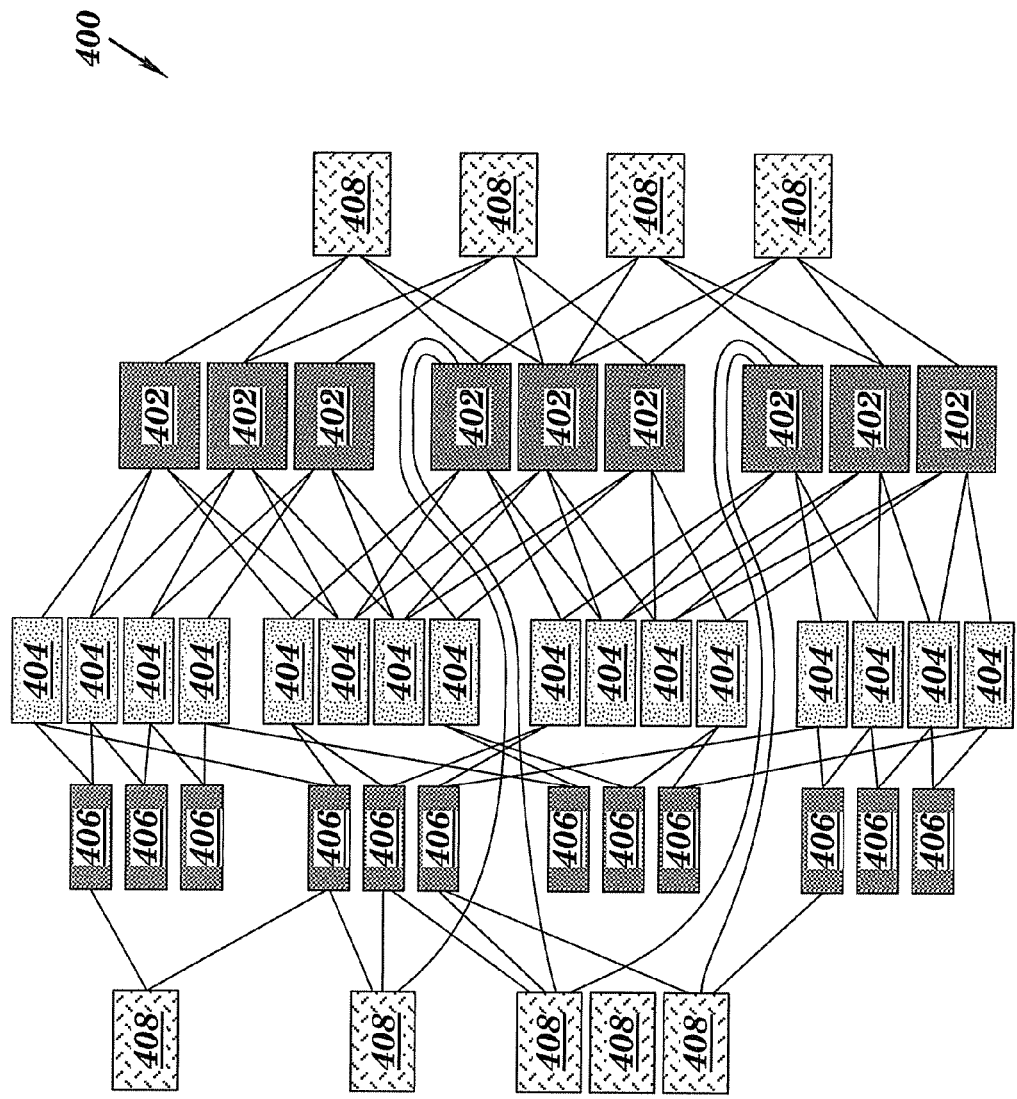
Figure 4C:
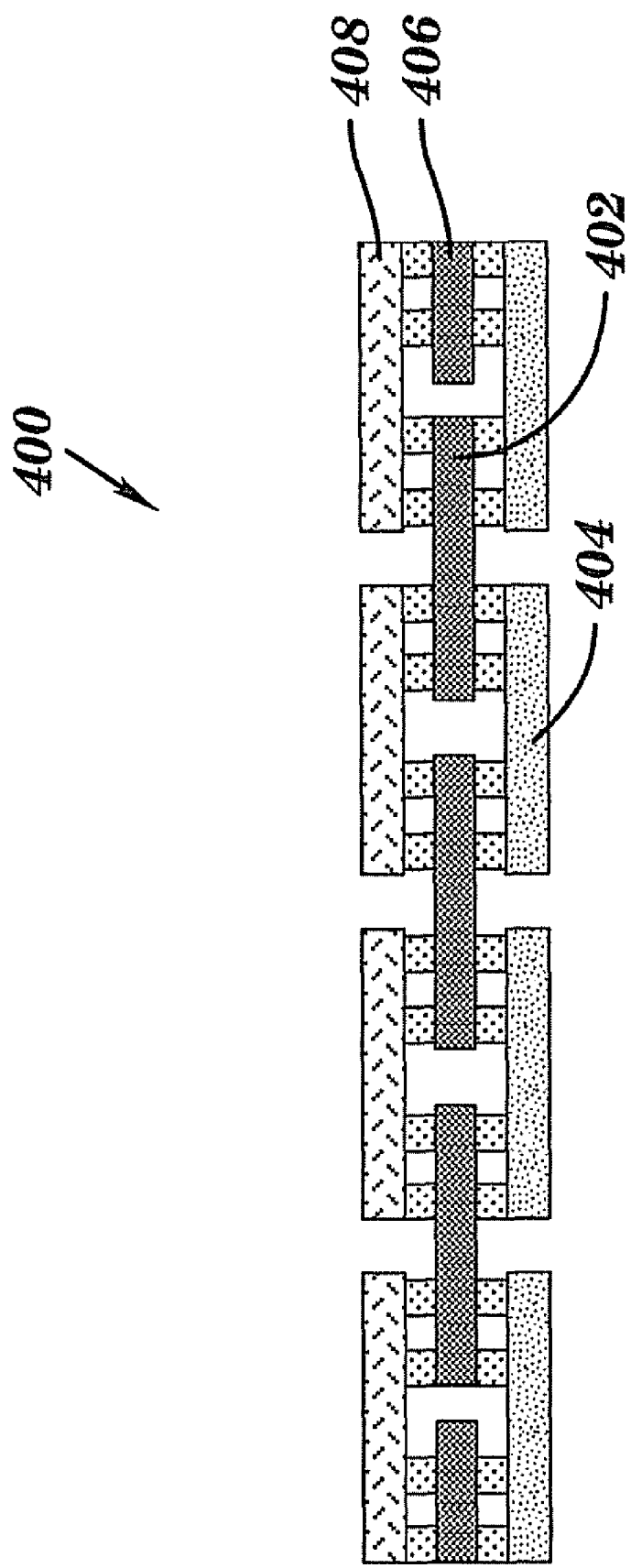

Turning now to FIG. 4, another three-dimensional interconnect network structure with full tiling and edge network elements in accordance with exemplary embodiments is illustrated generally as 400. FIG. 4a depicts a top view of the three-dimensional interconnect network structure 400, FIG. 4b depicts a network view of the three-dimensional interconnect network structure 400, and FIG. 4c depicts a side elevational view of the three-dimensional interconnect network structure 400. The three-dimensional interconnect network structure 400 includes switch chips 402, processor chips 404, edge switch chips 406, and an additional layer of switch chips 408. The three-dimensional interconnect network structure 400 provides significant bandwidth and redundancy. For purposes of clarity, not all connections and elements of the three-dimensional interconnect network structure 400 are shown in FIG. 4. Each processor chip 404 has four switch connections. Each switch chip 402 ties four processor chips together except for edge switch chips 406, which have two network connections. Switch chips 408 on the third layer connect four switch chips 402 or two edge switch chips 406 and two switch chips 402. As additional switch layers are added to the three-dimensional interconnect network structure 400, the mesh network capability of the network is increased. In other words the network becomes more tolerant of failed compute and network elements.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A multi-layer silicon stack architecture comprising:
   one or more processing layers comprised of one or more computing elements;
   one or more networking layers disposed between the processing layers, the network layer comprised of one or more networking elements, the one or more networking elements including one or more links to an external network,
   wherein each computing element comprises a plurality of network connections to adjacently disposed networking elements and each networking element may provide network access to a plurality of other computing elements through a single hop of the network.

2. The architecture of claim 1, wherein each computing element is connected to a plurality of networking elements.

3. The architecture of claim 2, wherein each networking element is connected to a plurality of computing elements.

4. The architecture of claim 3, wherein the computing elements and the networking elements are connected by one or more serial or parallel connections.

5. The architecture of claim 4, wherein the computing elements include a processor chip.

6. The architecture of claim 5, wherein the networking elements include a switch chip and an edge switch chip.

7. The architecture of claim 6, wherein the edge switch chip is connected to a plurality of processor chips.

8. The architecture of claim 7, wherein the networking elements include a switch chip on a third layer.

9. The architecture of claim 8, wherein the switch chip on a third layer is connected to a plurality of switch chips on a second layer.

10. The architecture of claim 9, wherein the processing layers and the networking layers combine to form a three-dimensional structure.

11. A multi-layer silicon stack architecture comprising:
   one or more processing layers comprised of one or more computing elements;
   one or more networking layers disposed between the processing layers, the network layer comprised of one or more networking elements, the one or more networking elements including one or more links to an external network,
   wherein each computing element comprises a plurality of network connections to adjacently disposed networking elements,
   each computing element is connected to a plurality of networking elements, each networking element is connected to a plurality of computing elements,
   the computing elements are connected to the networking elements by one or more serial or parallel connections,
   the computing elements include a processor chip,
   the networking elements include a switch chip and an edge switch chip,
   the edge switch chip is connected to two processor chips,
   the networking elements further include a switch chip on a third layer,
   the switch chip on a third layer is connected to four switch chips on a second layer, and
   each networking element may provide network access to up to eight other computing elements through a single hop of the network.

12. A multi-layer silicon stack architecture comprising:
   a first and second processing layer each comprised of one or more computing elements;
   a networking layer disposed between the first and second processing layers, the network layer comprised of one or more networking elements, the one or more networking elements including one or more links to an external network,
   wherein each computing element comprises a plurality of network connections to adjacently disposed networking elements,
   each computing element is connected to a plurality of networking elements, each networking element is connected to a plurality of computing elements,
   the computing elements are connected to the networking elements by one or more serial or parallel connections,
   the computing elements include a processor chip,
   the networking elements include a switch chip and an edge switch chip,
   the edge switch chip is connected to two processor chips,
   the networking elements further include a switch chip on a third layer,
   the switch chip on a third layer is connected to four switch chips on a second layer, and
   each networking element may provide network access to up to eight other computing elements through a single hop of the network.

* * * * *